(12) United States Patent
Zehavi et al.

(10) Patent No.: US 8,110,419 B2
(45) Date of Patent: Feb. 7, 2012

(54) PROCESS OF MANUFACTURING PHOTOVOLTAIC DEVICE

(75) Inventors: Sharone Zehavi, San Jose, CA (US); Jerome S. Culik, San Jose, CA (US)

(73) Assignee: Integrated Photovoltaic, Inc., San Jose, CA (US)

( * ) Notice: Subject to any disclaimer, the term of this patent is extended or adjusted under 35 U.S.C. 154(b) by 10 days.

(21) Appl. No.: 12/860,088

(22) Filed: Aug. 20, 2010

(65) Prior Publication Data

US 2011/0045630 A1 Feb. 24, 2011

Related U.S. Application Data

(60) Provisional application No. 61/235,610, filed on Aug. 20, 2009, provisional application No. 61/239,739, filed on Sep. 3, 2009.

(51) Int. Cl.
*H01L 21/00* (2006.01)
(52) U.S. Cl. ........... 438/22; 438/25; 438/26; 438/27; 438/48
(58) Field of Classification Search .......... 438/22–29, 438/406, 761; 437/455–459; 257/98–99
See application file for complete search history.

(56) References Cited

U.S. PATENT DOCUMENTS

| | | | |
|---|---|---|---|
| 3,078,328 A | 2/1963 | Jones | |
| 4,003,770 A | 1/1977 | Janowiecki | |
| 4,077,818 A | 3/1978 | Chu | |
| 5,057,163 A | 10/1991 | Barnett | |
| 7,576,368 B2 * | 8/2009 | Lee et al. | 257/99 |
| 2008/0023070 A1 | 1/2008 | Sinha | |
| 2008/0054106 A1 | 3/2008 | Zehavi | |
| 2008/0072953 A1 | 3/2008 | Stephens | |
| 2008/0220558 A1 | 9/2008 | Zehavi | |
| 2008/0295882 A1 | 12/2008 | Stephens | |
| 2009/0206354 A1 * | 8/2009 | Kitano et al. | 257/98 |
| 2010/0059107 A1 | 3/2010 | Barnett | |

OTHER PUBLICATIONS

"Silicon-Film™ Solar Cels by a Flexble Manufacurng System"; J. Rand, AstoPower Inc.; NREL/SR-520-30881; Feb. 2002.
"Thermal Simulation Model of a Roll-to-Roll Silicon Thin-Flim Solar Cell Deposition Reactor"; Nadir, K.; 2007 Society of Vacuum Coaters; 50th Annual Technical Conference Proceedings (2007); ISSN 0737-5921,192-194.
Tamura, F.; "Fabrication of poly- crystalline silicon films using plasma spray method"; Solar Energy Materials and Solar Cells, 34 (1994) 263-270.

* cited by examiner

*Primary Examiner* — Dung A. Le
(74) *Attorney, Agent, or Firm* — Fernandez & Associates, LLP

(57) ABSTRACT

An inline process for manufacturing a photovoltaic device on a removable substrate is disclosed. The process discloses two semiconductor layers forming an active region; at least one of the semiconductor layers is formed by a high-purity plasma spray process; optional layers include a release layer, one or more barrier layers, a cap layer, a conductive support layer, a mechanical support layer, an anti-reflection layer, and distributed Bragg reflector. The process may also be used to form multiple active regions.

15 Claims, 9 Drawing Sheets

Figure 7

| steps/layers | Required Steps | Optional Steps |
|---|---|---|
| 105 | Select substrtae | |
| 107 | | deposit substrate barrier layer |
| 110 | deposit 1st semiconductor layer | (1st conductivity) |
| 111 | | form/deposit cap layer |
| 152 | | Recrystallize 1st layer |
| 115 | | p-type layer |
| 330 | | deposit 1st barrier layer |
| 335 | | form vias |
| 120 | deposit 2nd semiconductor layer | (2nd conductivity) |
| 331 | | deposit 2nd barrier layer |
| 336 | | form vias |
| 130 | | deposit contact layer |
| 140 | | deposit anti-reflection layer |
| 145 | | metallization layer |

PROCESS OF MANUFACTURING PHOTOVOLTAIC DEVICE

PRIORITY

This application claims priority from U.S. Provisional Application Nos. 61/235,610 and 61/239,739 filed on Aug. 20, 2009 and Sep. 3, 2009 respectively.

CROSS-REFERENCE TO RELATED APPLICATIONS

This application is related in part to U.S. application Ser. Nos. 11/782,201, 12/074,651, 12/720,153, 12/749,160, 12/789,357, 61/235,610, 61/239,739 and U.S. Application titled "Photovoltaic Cell on Substrate", Ser. No. 12/860,088, filed on Aug. 19, 2010, all owned by the same assignee and incorporated by reference in their entirety herein. Additional technical explanation and background is cited in the referenced material.

BACKGROUND OF THE INVENTION

1. Field of the Invention

The invention relates generally to a photovoltaic device formed by the deposition of semiconductor based layers on a removable substrate.

2. Description of Related Art

Prior art in this area includes U.S. 2010/0059107; U.S. 2008/0295882; U.S. 2008/0072953; U.S. 2008/0023070; "Silicon-Film™ Solar Cells by a Flexible Manufacturing System"; J. Rand, AstroPower, Inc.; NREL/SR-520-30881; February 2002; "Thermal Simulation Model of a Roll-to-Roll Silicon Thin-Film Solar Cell Deposition Reactor"; Nadir, K.; 2007 Society of Vacuum Coaters; 50th Annual Technical Conference Proceedings (2007); ISSN 0737-5921,192-194. Preceding references incorporated in their entirety herein by reference. None of the cited prior art effectively addresses the primary issue for solar cells, namely low manufacturing cost coupled with commercial level conversion efficiency; solar cell module costs must be below $0.50/watt to begin to achieve parity with conventional utility pricing.

BRIEF SUMMARY OF THE INVENTION

An inline process for manufacturing a photovoltaic device on a removable substrate is disclosed. The process discloses two semiconductor layers forming an active region; at least one of the semiconductor layers is formed by a high-purity plasma spray process; optional layers include a release layer, one or more barrier layers, a cap layer, a conductive support layer, a mechanical support layer, an anti-reflection layer, distributed Bragg reflector. The process may also be used to form multiple active regions.

BRIEF DESCRIPTION OF THE SEVERAL VIEWS OF THE DRAWINGS

FIG. 7 is a process flow showing optional layers and steps.

DETAILED DESCRIPTION OF THE INVENTION

Figure 1A:
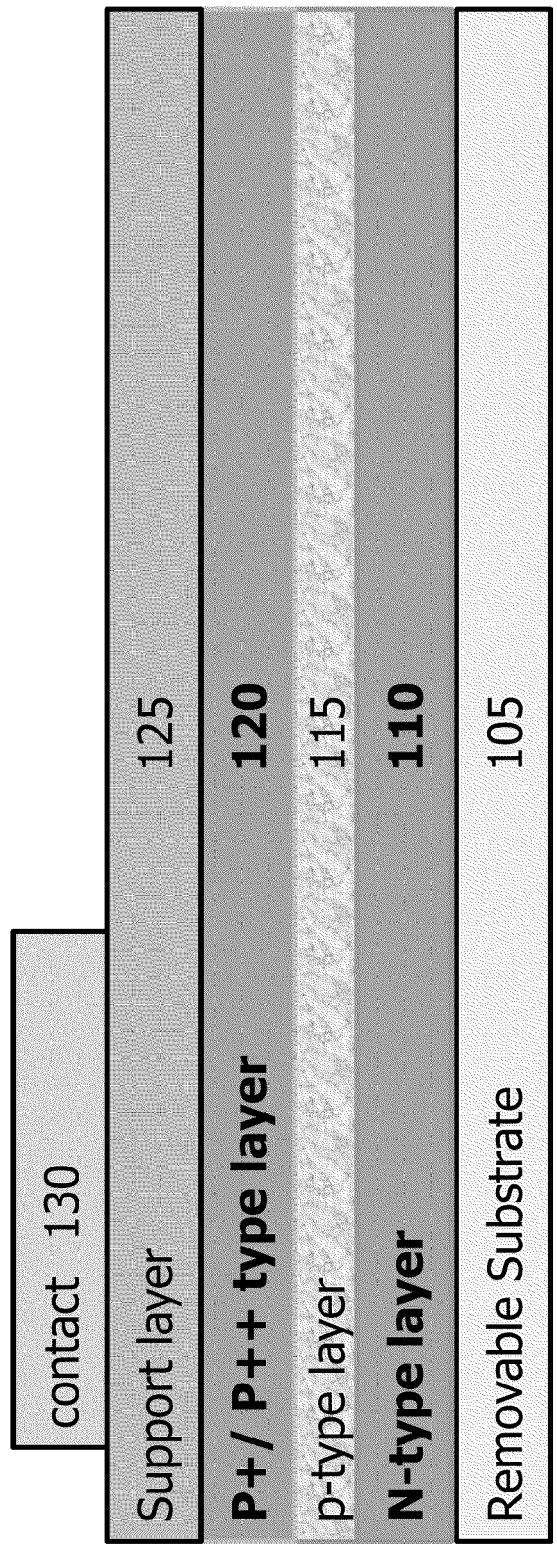
FIG. 1A is a schematic drawing of a first embodiment.
Figure 1B:
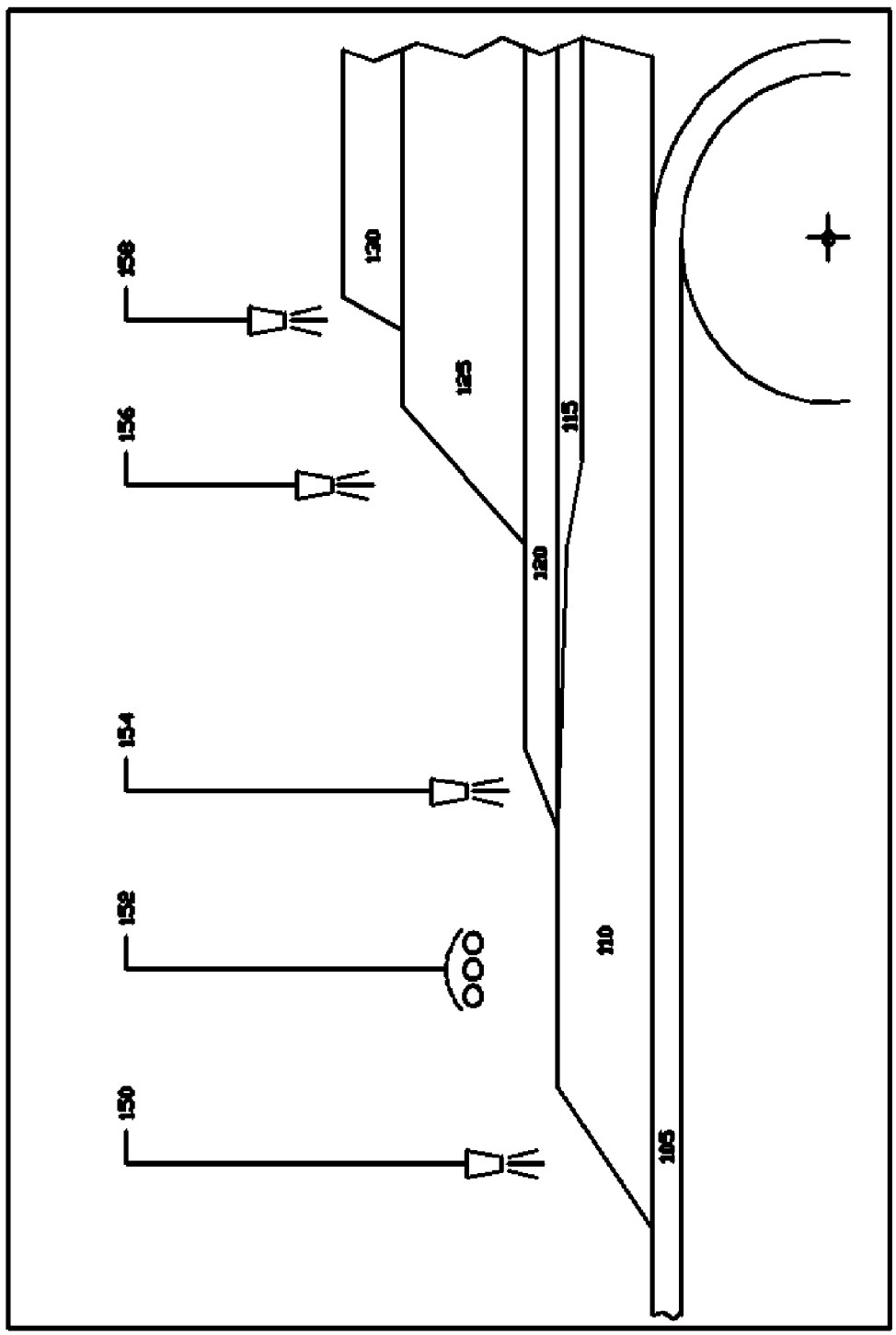
FIG. 1B is a schematic drawing of the first embodiment including sequential deposition steps.

In some embodiments, as in FIG. 1 a layer of high purity n-type silicon 110 is deposited on a flexible, supporting, removable substrate 105 such as stainless steel sheet, graphite foil, flexible foil coated with graphite, stainless steel sheet coated with graphite or other material suitable for roll-to-roll deposition. This high purity n-type silicon layer may be in the range of about 0.01 to more than 100 microns thick. There may be a release layer 106 such as silicon nitride applied to a flexible substrate before an n-type silicon layer is deposited onto a flexible, supporting, removable substrate. A deposition process, 150 and 154, may be any method or combination of methods, including CVD, PVD, MOCVD, PECVD, RF-PECVD and high-purity plasma spraying and others known to one knowledgeable in the art.

In some embodiments the deposited n-type silicon layer is then recrystallized to form the light-absorbing layer of the solar cell. The deposited n-type silicon layer is recrystallized at high temperature to increase the crystal grain size and to improve its electrical characteristics. The recrystallization process can be accomplished by means of laser, IR heating, RF heating, resistive heating, or combinations of these, 152. In some embodiments a "cap layer" of thin silicon nitride or thin silicon oxide is formed on the n-type silicon before or during recrystallization; optionally, this layer is formed in lieu of recrystallization. A cap layer, 111, shown in FIG. 7, may be formed by exposing the n-type silicon to a nitriding or oxidizing ambient at an appropriate elevated temperature; optionally, a cap layer may be deposited.

In some embodiments a recrystallization process may occur in a gaseous atmosphere such as oxygen or nitrogen that is conducive to forming a capping layer on the top surface of the recrystallized n-type silicon layer; alternatively, a reducing atmosphere may be used; alternatively, helium or hydrogen may be added to improve thermal conductivity of the atmosphere.

Figure 3:
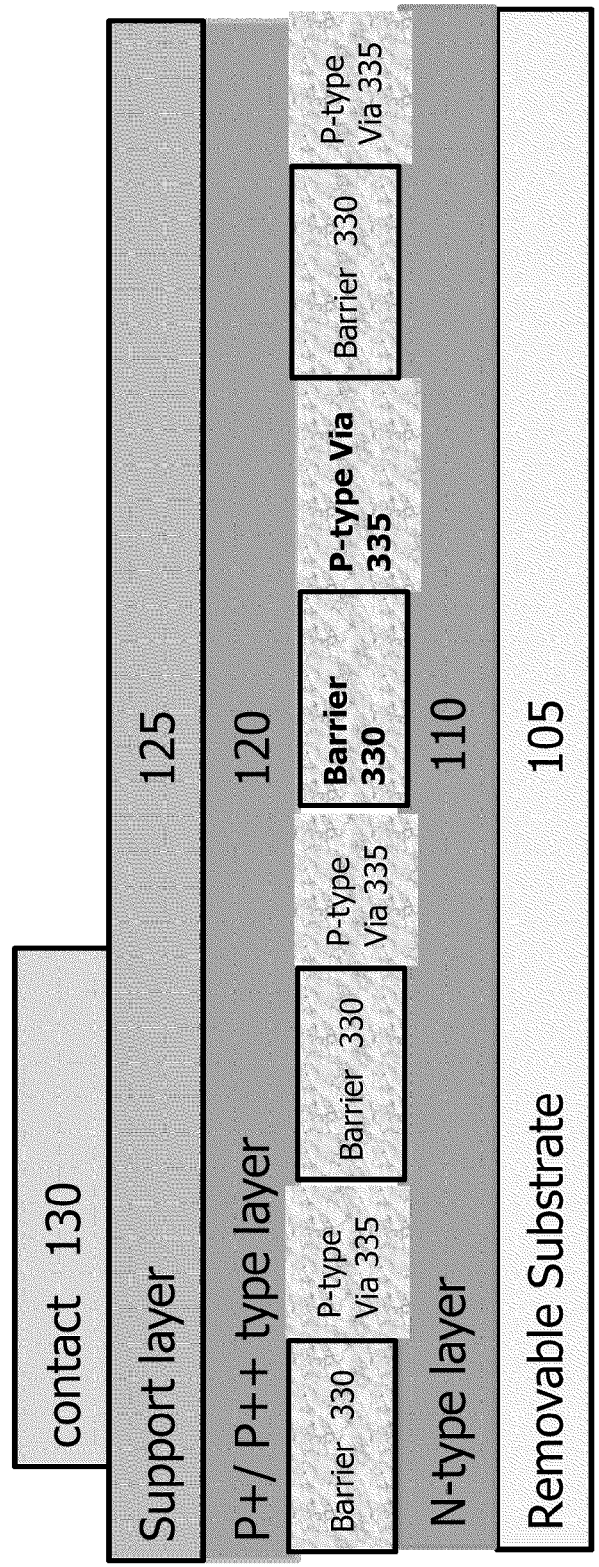
FIG. 3 is a schematic drawing of a third embodiment.

In some embodiments in addition to the capping layer, a first semiconductor barrier layer 330 consisting of an oxide, a nitride, a carbide, or a combination of these, can be applied, 564, to the, optionally, recrystallized n-type, as shown in FIG. 3. An optional capping layer and a first barrier layer can be structured to have vias, 335, through the layer(s) at regular intervals. Vias may be formed by laser machining, lithography or by other physical means, 566 and 570. In addition to these intentional means, random vias, such as from pinholes, may be obtained through this first barrier layer. The density of vias, whether by laser machining, lithography, or by random pinhole, will be sufficient to minimize series resistance losses through this first barrier layer.

In some embodiments, next a p++ and/or p+ silicon layer(s), 120, is (are) deposited on top of the recrystallized n-type silicon/flexible substrate combination; optionally, a capping and/or first barrier layers may be present at the deposition surface. The purpose of this p++ (or p+) silicon layer is to ultimately form rectifying p-n junctions. The junction can be formed by thermal diffusion of p-type dopant into the n-type layer, or by ion implantation or by a deposition step. The heat of deposition of this p++ (or p+) silicon layer may by itself be sufficient to form a rectifying junction. Optionally, a subsequent heating step can be used to form or to complete the rectifying p-n junction.

In some embodiments a silicon, or other semiconductor, layer, as deposited is amorphous, nano-crystalline, micro-crystalline, or macro-crystalline; in some embodiments the layer is hydrogenated, for example, Si:H; alternatively, nc-Si: H. In some embodiments a silicon, or other semiconductor, layer, after recrystallization is nano-crystalline, micro-crystalline, or macro-crystalline; in some embodiments a semiconductor layer is hydrogenated, such as Si:H; alternatively, nc-Si:H, nano-crystalline hydrogenated silicon. In some embodiments a recrystallized, deposited semiconductor layer exhibits a minority carrier diffusion length greater than a grain size lateral dimension and a grain size lateral dimension larger than the deposited material layer thickness; optionally, a deposited material layer thickness may vary from about 0.01 microns to about 100 microns. In some embodiments a deposited semiconductor layer is chosen substantially from a group consisting of silicon, germanium, silicon-germanium alloys, Group IV elements or compounds, Group III-V compounds and Group II-VI compounds.

In some embodiments a silicon or germanium or a SiGe semiconductor layer is in a state of strain such that it has a direct band gap. For a silicon layer strain may be induced by alloying with germanium and/or carbon; alternatively strain may be induced by a deposited layer of different thermal expansion coefficient in proximity to the semiconductor layer.

Figure 4:
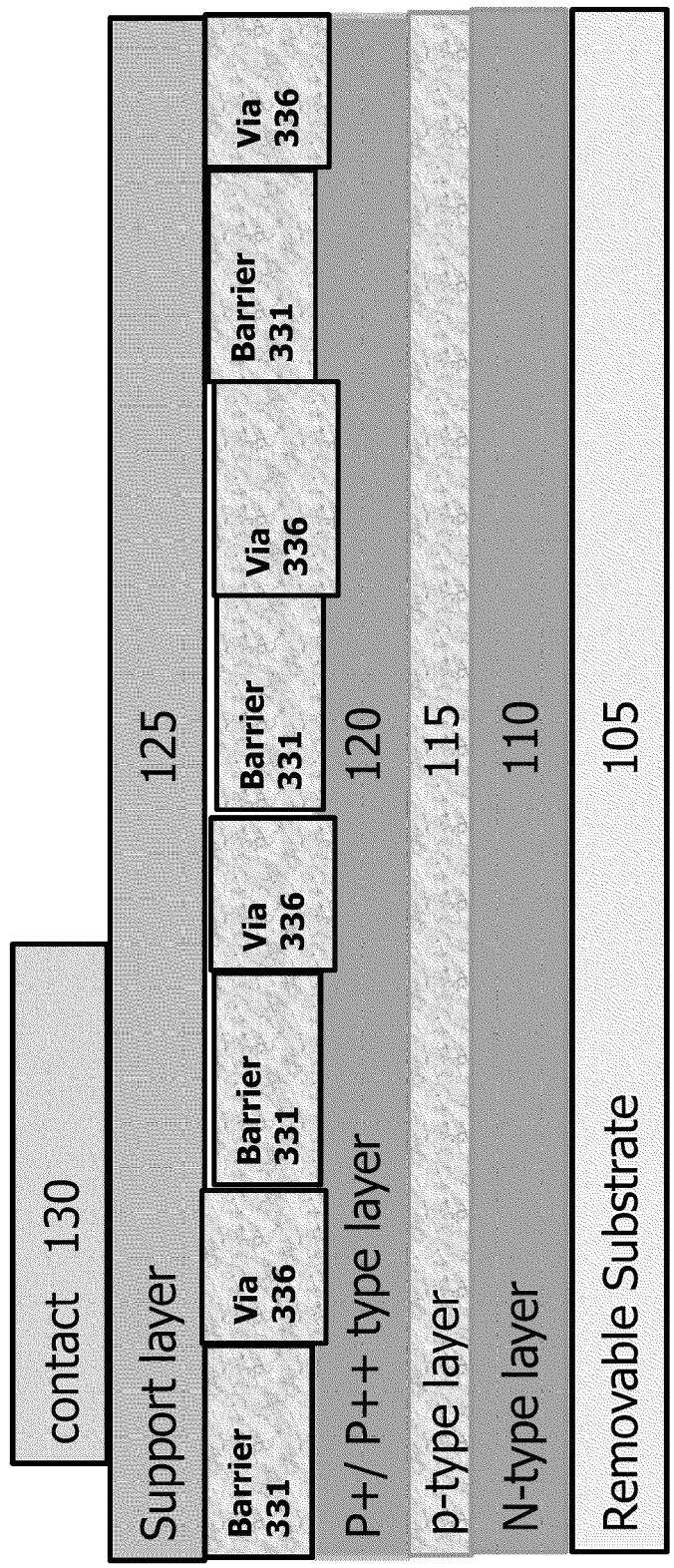
FIG. 4 is a schematic drawing of a fourth embodiment.
Figure 5A:
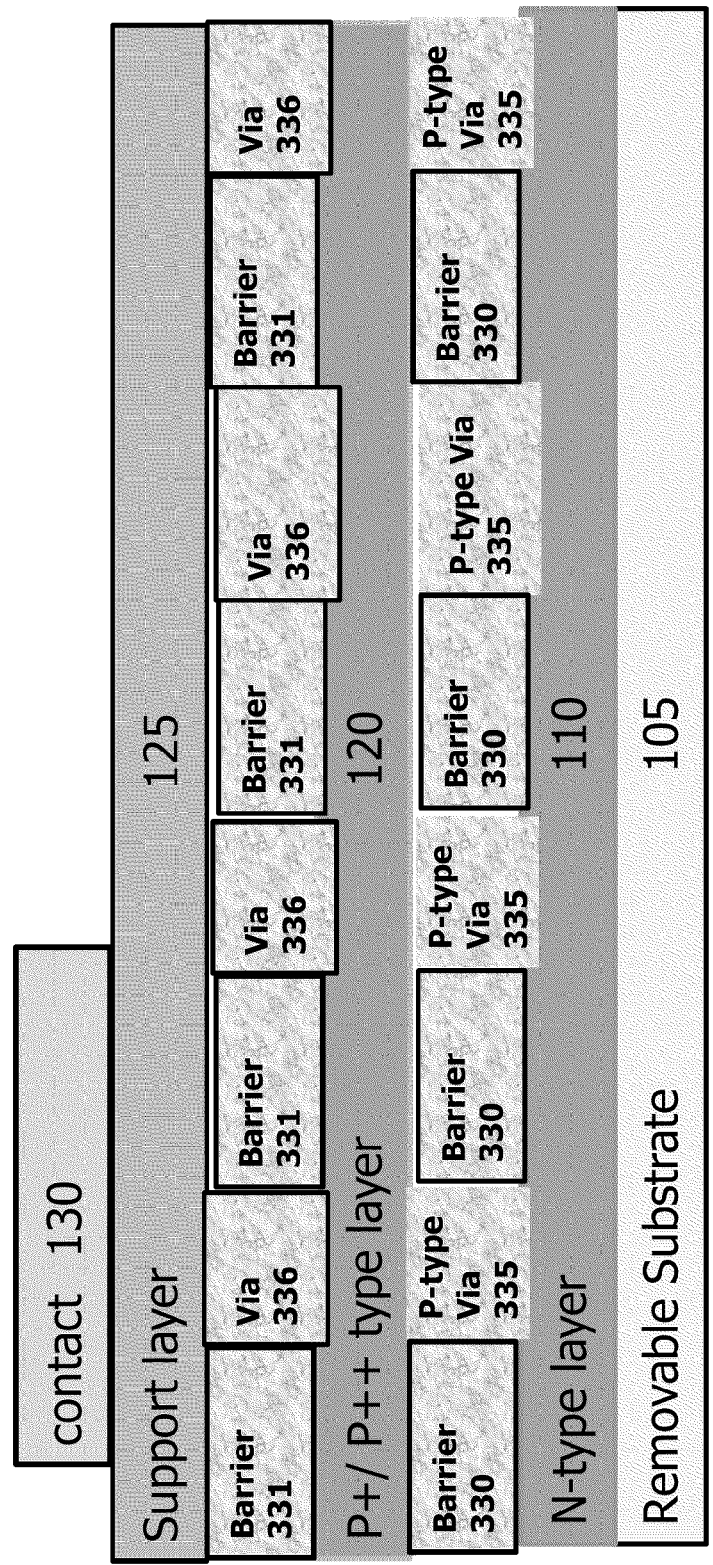
FIG. 5A is a schematic drawing of a fifth embodiment.
Figure 5B:
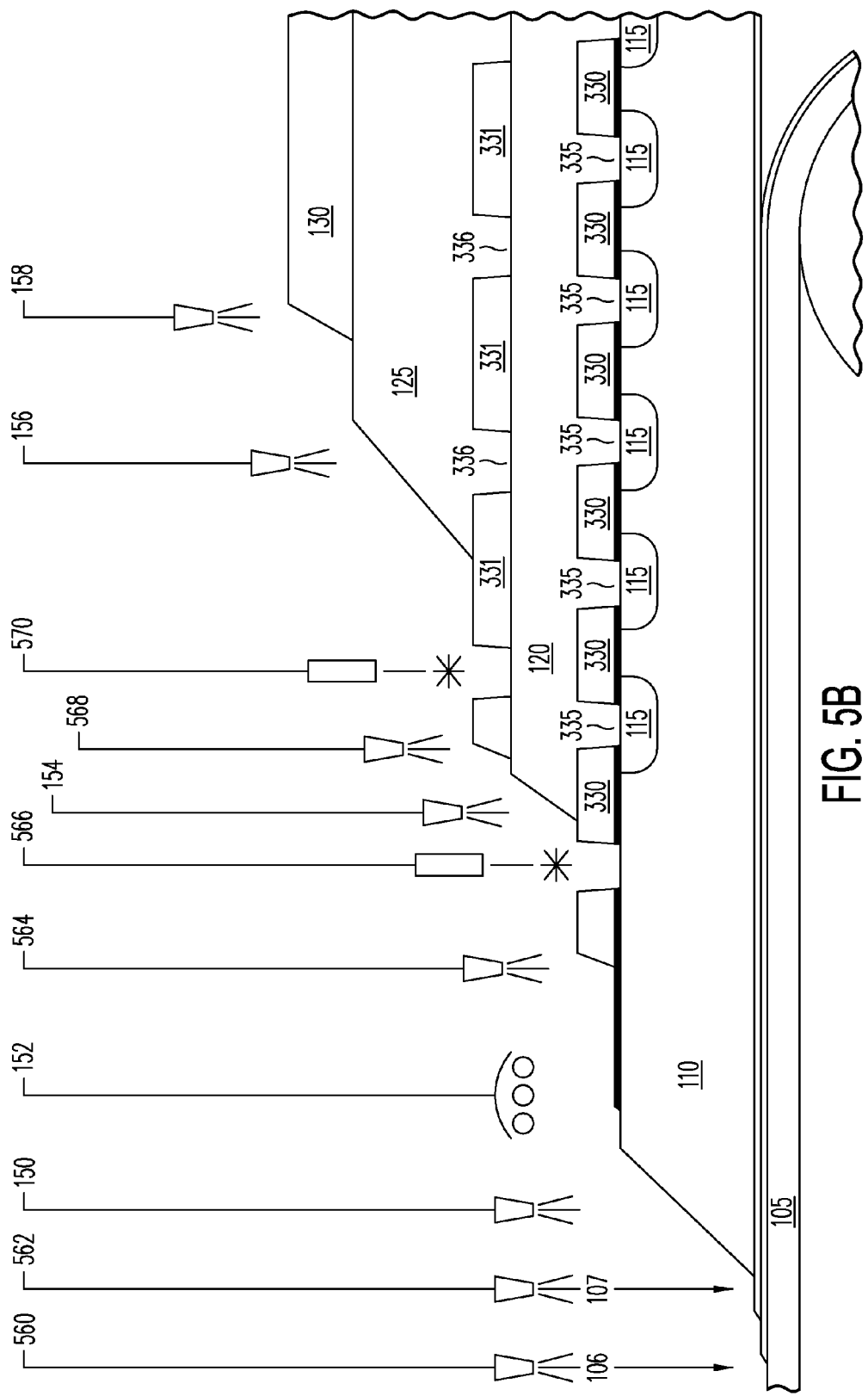
FIG. 5B is a schematic drawing of the fifth embodiment including sequential deposition steps.

In some embodiments a second semiconductor barrier layer, 331, is deposited, 568, next onto the p+/p++/n-base structure, as shown in FIG. 4. The purpose of this layer is to isolate the active layers from the subsequently applied mechanical support layer, 125. The second barrier layer may comprise an oxide, a nitride, a carbide, or a combination of these. As with the first barrier layer, the density of optional vias, 336, whether by laser machining, 570, or by random pinhole, will be sufficient to minimize series resistance losses through the barrier layer. Second semiconductor barrier layer, 331, may be of conductive material like TiN or doped SiC, and conducting vias, 336 are optional. FIG. 5A shows an embodiment with both barrier layers, 330 and 331.

In some embodiments a mechanical support layer 125 is deposited or applied onto the p++/p+/barrier/n/substrate structure. The mechanical support layer may be silicon, metallurgical grade silicon, metal, carbon based material or a combination of the above. The mechanical support layer can be deposited by a variety of methods, including plasma deposition, 156, sintering or glued or bonded to the previous material stack. In case of deposition the heat of this deposition step may also be used to form or to complete rectifying p-n junction, 115, by diffusing p-dopant into the recrystallized n-type layer; optionally, layer 115 is deposited as a p-type layer. In some embodiments a support layer a metal foil, such as aluminum, attached with conductive adhesive, solder or eutectic bond to the previous layer; optionally a support layer may be stainless, carbon foil, or other materials known to one knowledgeable in the art.

In some embodiments a metal-bondable aluminum or solderable metal, 130, may be deposited, 158, onto the layered structure to form an electrical contact. When the process is complete, this will become the "back" contact of the solar cell device, on the face away from the sunlight.

In some embodiments a second barrier layer and/or a mechanical support layer may, optionally, be operable as a distributed Bragg reflector, DBR, to reflect at least a portion of any transmitted radiation back into the active region.

In some embodiments once a device structure, optionally a solar cell, is mechanically stabilized it can be removed from a flexible, supporting, removable substrate, 105. The flexible, supporting, removable substrate may then be re-used in another manufacturing cycle; optionally, a removable substrate may be consumed in a removal process; for instance, ablation by laser may be used to remove a removable substrate; optionally, oxidation or chemical etching may be a means for removing a removable substrate. A flexible, supporting, removable substrate may or may not need to be recoated with a release material before being reused. Optionally, a flexible, supporting, removable substrate may have a protective overcoating layer such as mullite, $Al_6Si_2O_{13}$, or a mullite plus yttria stabilized zirconia (YSZ) overcoat, compositionally graded to improve thermal expansion matching with silicon.

Figure 2:
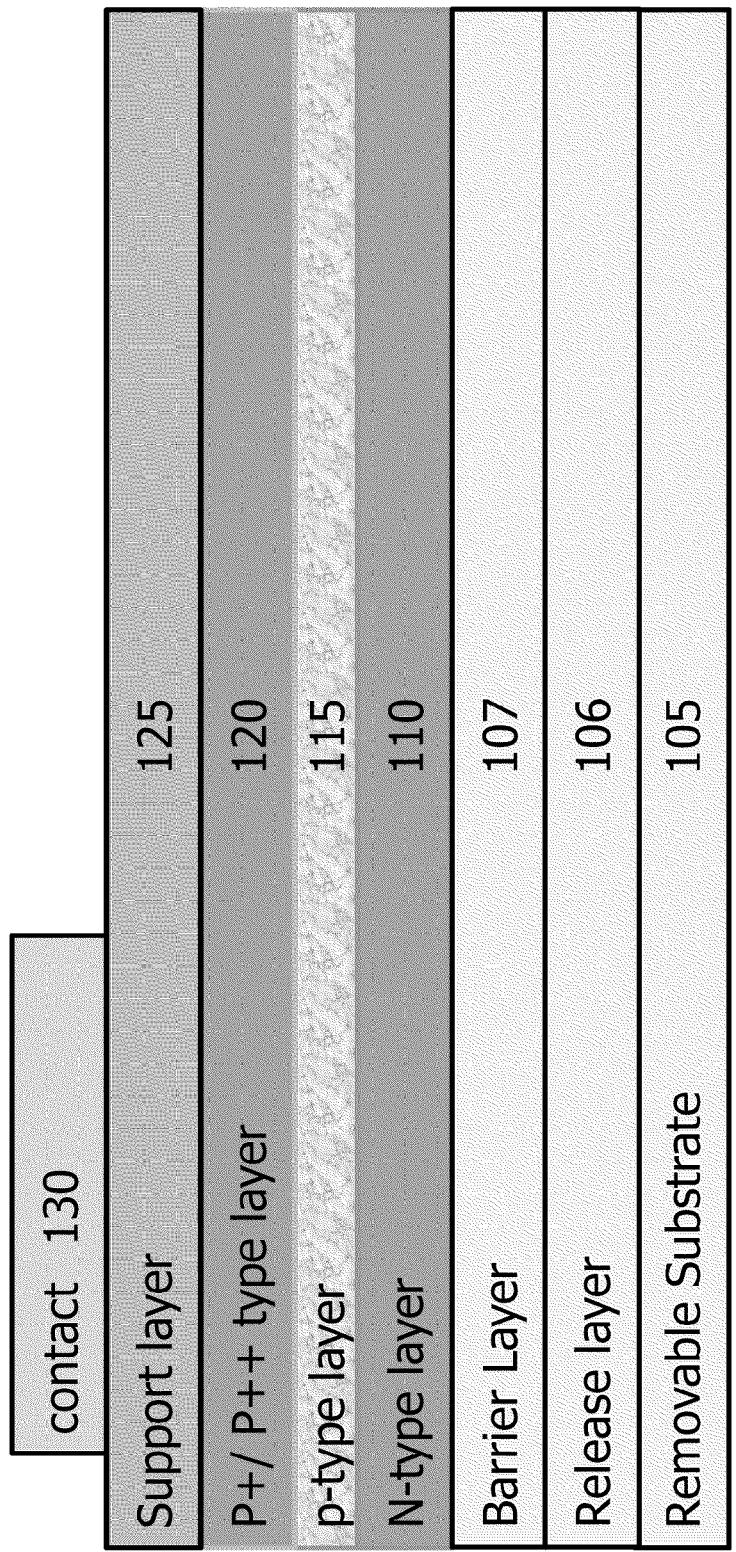
FIG. 2 is a schematic drawing of a second embodiment.

A release layer, 106, facilitates or enables easy removal of a device structure from a flexible, supporting, removable substrate. In some embodiments a release material is a sheet, foil or layer mechanically placed or attached to the flexible, supporting, removable substrate comprising a material such as graphite, graphite foil, glassy graphite, impregnated graphite, pyrolytic carbon, pyrolytic carbon coated graphite, flexible foil coated with graphite and carbon or other material that may be easily oxidized at a temperature below silicon's melting point. Optionally, a release layer may be a layer deposited or applied to a flexible, supporting, removable substrate comprising a material such as silicon nitride, silicon dioxide, phosphosilicate glass, PSG, heavily doped $SiO_2$, or combinations of all, including stoichiometric and non-stoichiometric combinations; a release layer may be applied by a deposition process such as CVD, PVD, plasma spray, e-beam, or ultrasonic spray as available from Ultrasonic Systems of Haverhill, Mass.; [ultraspray.com]. In some embodiments a release layer is removable by a chemical reaction such as ablation, oxidation or chemical milling. In some embodiments a substrate barrier layer, 107, is placed between the removable substrate and the first semiconductor layer, 110; optionally a release layer 106 is between the substrate barrier layer and the removable substrate, as shown in FIG. 2. In some embodiments the substrate barrier layer functions as an anti-reflection layer also. In some embodiments removable substrate is removable by a chemical reaction such as ablation, oxidation or chemical milling.

Figure 6:
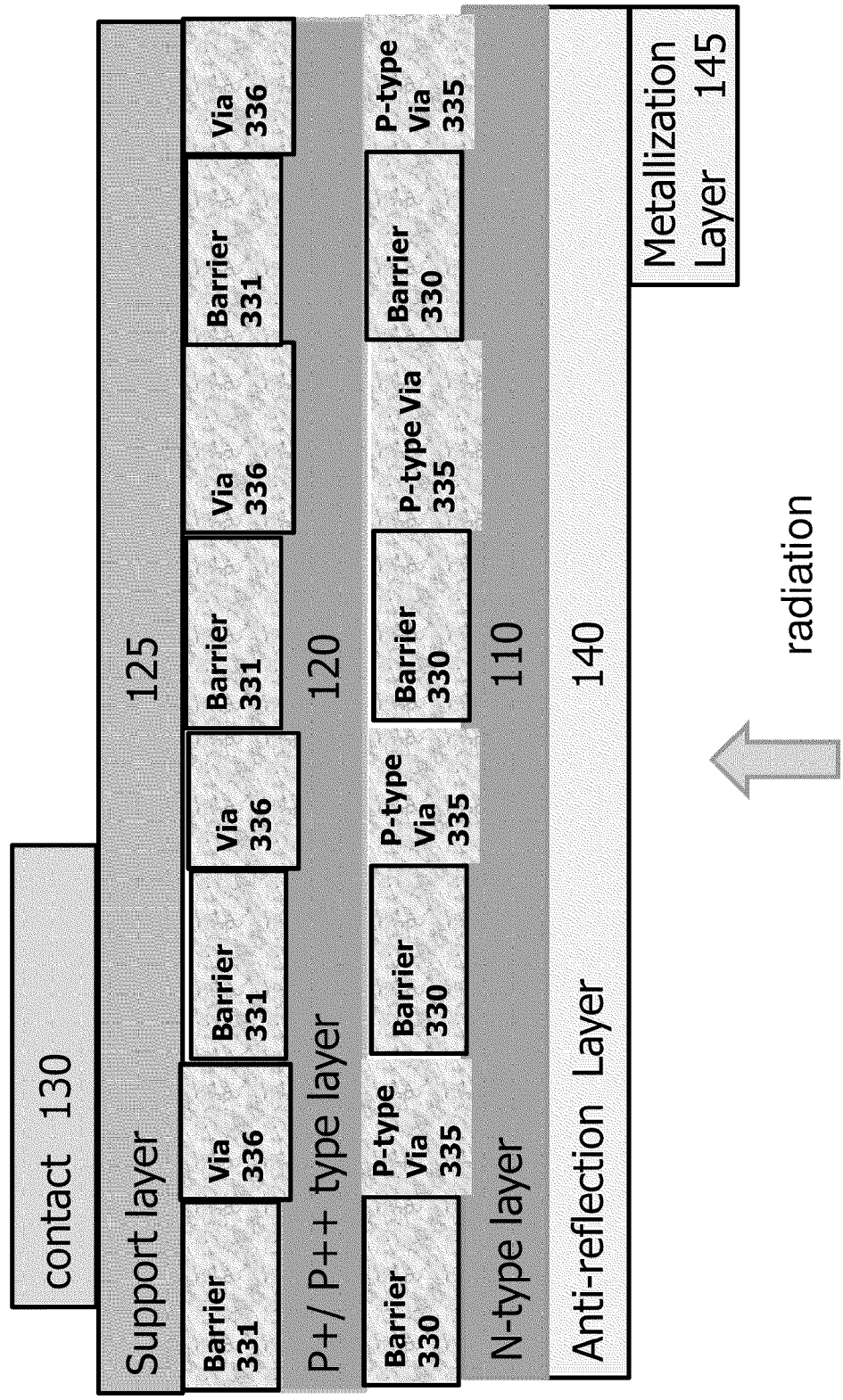
FIG. 6 is a schematic drawing of a sixth embodiment.

In some embodiments, FIG. 6, a solar cell also comprises a surface passivation layer, optionally, an antireflection coating, 140, and, optionally, contact metallizations, not shown, added to the top-side, where the top-side is the surface where radiation enters the device initially. Conventional contact metallization that are commonly used for crystalline silicon solar cells can be applied to this structure.

FIG. 7 shows how various photovoltaic structures may be configured. All structures and processes have the "required layers" and steps. The instant invention discloses the various structures comprising various combinations of the optional layers from no optional layers up to and including all of the optional layers and or process steps.

In some embodiments, in a device just removed from a removable substrate, the top layer, herein defined as the layer upon which radiation is initially incident, is n-type silicon; optionally, a n-type diffusion is used, together with a passivating oxide or alone, to reduce front surface recombination. The advantage of the disclosed junction structure is that a high resistivity, highly transparent n-type diffusion is sufficient for surface passivation, and there is no interference by a passivating oxide to the antireflection coating. Another advantage of this structure is that it is very tolerant of lower-quality and/or lower minority-carrier lifetime silicon. Another advantage of this design is that the base layer is n-type, which adds to its tolerance of metallic impurities. As part of post-removable-substrate-removal processing, optionally, an anti-reflection layer 140 and/or a metallization layer 145 may be added; in some embodiments layer 140 is silicon nitride or titanium dioxide and a "fire-through" process is used in conjunction with a screen printed metallization layer so as to avoid making explicit vias in layer 140.

In some embodiments a process for manufacturing a photovoltaic device on a removable substrate comprises the steps: depositing a first semiconductor layer of a first conductivity type onto a removable substrate; depositing a second semiconductor layer of a second conductivity type onto the first semiconductor layer; applying a first support layer, optionally conductive, onto the second semiconductor layer; and removing the removable substrate; optionally, additional steps comprising one or more of the following may be added: recrystallizing the first semiconductor layer before depositing a second semiconductor layer of a second conductivity type onto the first layer, depositing a substrate barrier layer onto the removable substrate such that the substrate barrier layer is between the removable substrate and the first semiconductor layer; depositing a release layer onto the removable substrate such that the release layer is between the removable substrate and the first semiconductor layer; optionally, the release layer consists of a material consumable by a predetermined chemical reaction; optionally, the first and second semiconductor layers comprise a Group IV, III-V or II-VI semiconductor; optionally, additional steps comprising one or more of the following may be added: depositing a first semiconductor barrier layer 330 on the first semiconductor layer; and forming vias 335 in the first semiconductor barrier layer such that area fraction of vias in the first semiconductor barrier layer 330 is between about 0.01 and 0.20, wherein the additional steps are done just prior to depositing a second semiconductor layer of a second conductivity type onto the first layer; forming multiple p-n junctions between the first and second semiconductor layers about the vias wherein the additional step is done just after the depositing a second semiconductor layer of a second conductivity type onto the first layer; forming a cap layer consisting of silicon nitride or silicon oxide on top of the first semiconductor layer before depositing a second semiconductor layer; applying a mechanical support layer to the first conductive support layer before removing the removable substrate; adding a second semiconductor barrier layer 331 between the second semiconductor layer and the first conductive support layer; forming vias 336 in the second barrier layer; optionally, wherein the removable substrate comprises a material consumable by one of ablation, oxidation and chemical milling.

In some embodiments a process for manufacturing a photovoltaic device on a removable substrate comprises the steps: depositing a first transparent barrier layer onto a removable substrate; depositing a first semiconductor layer of a first conductivity type onto the first transparent barrier layer; depositing a second semiconductor layer of a second conductivity type onto the first semiconductor layer, wherein the means for depositing the first or second semiconductor layer comprises a high-purity plasma spray; applying a first conductive support layer onto the second semiconductor layer; and removing the removable substrate; optionally, an additional step may be added comprising recrystallizing the first semiconductor layer before depositing a second semiconductor layer of a second conductivity type onto the first semiconductor layer.

In some embodiments a process for manufacturing a photovoltaic device on a removable substrate comprises the steps: depositing a first transparent barrier layer onto a removable substrate; depositing a first semiconductor layer of a first conductivity type onto the first transparent barrier layer; forming a cap layer on the first semiconductor layer; depositing a second semiconductor layer of a second conductivity type onto the cap layer, wherein the means for depositing the first or second semiconductor layer comprises a high-purity plasma spray; applying a first support layer, optionally conductive, onto the second semiconductor layer; and removing the removable substrate. As used herein, "transparent barrier layer" or "transparent" or "reflective" in general applies to at least some portion of the solar spectrum; a "transparent layer" or "reflective layer" need not be transparent or reflective to the entire solar spectra; rather transparent or reflective to a portion of the spectra qualifies as transparent and reflective.

The foregoing described embodiments of the invention are provided as illustrations and descriptions. They are not intended to limit the invention to a precise form as described. In particular, it is contemplated that functional implementation of invention described herein may be implemented equivalently in various combinations or other functional components or building blocks. Other variations and embodiments are possible in light of above teachings to one knowledgeable in the art of semiconductors, thin film deposition techniques, and materials; it is thus intended that the scope of invention not be limited by this Detailed Description, but rather by Claims following. All patents, patent applications, and other documents referenced herein are incorporated by reference herein in their entirety for all purposes.

In the preceding description, numerous specific details are set forth, such as particular structures, components, materials, dimensions, processing steps and techniques, in order to provide a thorough understanding of the present invention. However, it will be appreciated by one of ordinary skill in the art that the invention may be practiced without these specific details. In other instances, well-known structures or processing steps have not been described in detail in order to avoid obscuring the invention.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

We claim:

1. A process for manufacturing a photovoltaic device on a removable substrate comprising the steps:
   depositing a first semiconductor layer of a first conductivity type onto a removable substrate;
   recrystallizing the first semiconductor layer;
   depositing a second semiconductor layer of a second conductivity type onto the first semiconductor layer;
   applying a first conductive support layer onto the second semiconductor layer; and
   removing the removable substrate.

2. The process as in claim 1 comprising the additional step of:
   depositing a substrate barrier layer onto the removable substrate such that the substrate barrier layer is between the removable substrate and the first semiconductor layer.

3. The process as in claim 1 comprising the additional step of:
depositing a release layer onto the removable substrate such that the release layer is between the removable substrate and the first semiconductor layer.

4. The process as in claim 3 wherein the release layer consists of a material consumable by a predetermined chemical reaction.

5. The process as in claim 1 wherein the first and second semiconductor layers comprise a Group IV, III-V or II-VI semiconductor.

6. The process as in claim 1 comprising the additional steps of:
depositing a first semiconductor barrier layer on the first semiconductor layer; and
forming vias in the first barrier layer such that area fraction of vias in the first barrier is between about 0.01 and 0.20, wherein the additional steps are done just prior to depositing a second semiconductor layer of a second conductivity type onto the first layer.

7. The process as in claim 6 comprising the additional step of:
forming multiple p-n junctions between the first and second semiconductor layers about the vias wherein the additional step is done just after the depositing a second semiconductor layer of a second conductivity type onto the first layer.

8. The process as in claim 1 comprising the additional step:
forming a cap layer consisting of silicon nitride or silicon oxide on top of the first semiconductor layer before depositing a second semiconductor layer.

9. The process as in claim 1 comprising the additional step of:
applying a mechanical support layer to the first conductive support layer before removing the removable substrate.

10. The process as in claim 1 comprising the additional step of:
adding a second barrier layer between the second semiconductor layer and the first conductive support layer.

11. The process as in claim 10 comprising the additional step of:
forming vias in the second semiconductor barrier layer.

12. The process as in claim 1 wherein the removable substrate comprises a material consumable by one of ablation, oxidation and chemical milling.

13. A process for manufacturing a photovoltaic device on a removable substrate comprising the steps:
depositing a first transparent barrier layer onto a removable substrate;
depositing a first semiconductor layer of a first conductivity type onto the first transparent barrier layer;
depositing a second semiconductor layer of a second conductivity type onto the first semiconductor layer, wherein the means for depositing the first or second semiconductor layer comprises a high-purity plasma spray;
applying a first conductive support layer onto the second semiconductor layer; and
removing the removable substrate.

14. The process as in claim 12 comprising the additional step:
recrystallizing the first semiconductor layer before depositing a second semiconductor layer of a second conductivity type onto the first semiconductor layer.

15. A process for manufacturing a photovoltaic device on a removable substrate comprising the steps:
depositing a first transparent barrier layer onto a removable substrate;
depositing a first semiconductor layer of a first conductivity type onto the first transparent barrier layer;
forming a cap layer on the first semiconductor layer;
depositing a second semiconductor layer of a second conductivity type onto the cap layer, wherein the means for depositing the first or second semiconductor layer comprises a high-purity plasma spray;
applying a first support layer onto the second semiconductor layer; and
removing the removable substrate.

* * * * *